United States Patent
Pu et al.

(10) Patent No.: US 8,605,520 B2
(45) Date of Patent: Dec. 10, 2013

(54) REPLACEABLE, PRECISE-TRACKING REFERENCE LINES FOR MEMORY PRODUCTS

(75) Inventors: Lejan Pu, San Jose, CA (US); Toshio Sunaga, Ohtso (JP)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/924,184

(22) Filed: Sep. 22, 2010

(65) Prior Publication Data

US 2012/0069644 A1    Mar. 22, 2012

(51) Int. Cl.
*G11C 7/00* (2006.01)

(52) U.S. Cl.
USPC ................ 365/189.15; 365/200; 365/158

(58) Field of Classification Search
USPC ............ 365/163, 148, 158, 189.09, 230.03, 365/189.08, 200, 201, 210.1
See application file for complete search history.

(56) References Cited

U.S. PATENT DOCUMENTS

| | | | | |
|---|---|---|---|---|
| 6,055,178 A * | 4/2000 | Naji | ............... | 365/158 |
| 6,111,781 A * | 8/2000 | Naji | ............... | 365/158 |
| 6,438,053 B1 * | 8/2002 | Pochmuller | ............. | 365/210.12 |
| 6,549,473 B2 * | 4/2003 | Rolandi et al. | ........... | 365/185.13 |
| 6,847,561 B2 * | 1/2005 | Hashimoto et al. | ...... | 365/189.07 |
| 6,930,922 B2 | 8/2005 | Mori et al. | | |
| 7,113,437 B2 * | 9/2006 | Schweickert et al. | | |
| 7,379,359 B2 * | 5/2008 | Sakakibara | ................. | 365/200 |
| 7,414,908 B2 * | 8/2008 | Miyatake et al. | ......... | 365/210.1 |
| 7,495,984 B2 * | 2/2009 | Kim et al. | ................... | 365/210.1 |
| 7,529,115 B2 * | 5/2009 | Yamamura | .................... | 365/145 |
| 7,969,765 B2 * | 6/2011 | Sekiguchi et al. | ............ | 365/149 |
| 8,009,467 B2 * | 8/2011 | Nebashi et al. | ............... | 365/158 |
| 2002/0080644 A1 * | 6/2002 | Ito | ................. | 365/158 |
| 2006/0034133 A1 * | 2/2006 | Sekiguchi et al. | ............ | 365/190 |
| 2009/0067274 A1 | 3/2009 | Beer | | |
| 2010/0195422 A1 | 8/2010 | Imai | | |

* cited by examiner

*Primary Examiner* — Gene Auduong
(74) *Attorney, Agent, or Firm* — Saile Ackerman LLC; Stephen B. Ackerman

(57) ABSTRACT

Systems and methods to improve reliability of sensing operations of semiconductor memory arrays requiring reading references such as MRAM or any type of phase change memory (PCM), and to improve yield of the memory arrays have been achieved. The memory array is divided into multiple parts, such as sections or segments. Reference word lines or reference bit lines or both are deployed in each of the multiple parts. Thus, the distance between an accessed line and the correspondent reference line is reduced, and hence the parasitic parameter tracking capability is enhanced significantly. Additionally spare reference word lines or spare reference bit lines can be deployed in each of the multiple parts.

15 Claims, 5 Drawing Sheets

REPLACEABLE, PRECISE-TRACKING REFERENCE LINES FOR MEMORY PRODUCTS

BACKGROUND (1) Field

This invention relates generally to memory products and relates more specifically to reference line structures associated with a reading cell.

(2) Description of the Prior Art

In a read operation of memory chips, a sense amplifier compares a reference signal, which is middle point between stored 1 and 0 signals, with a stored signal. There are various ways to provide such reference signals. FIGS. 1 a+b prior art show two examples used in conventional memories. For memories, in which an adjacent bit line to the accessed bit line can be used to put the reference signal, a pair of reference word lines is generally exploited. A folded bit line memory array is the typical example, and FIG. 1a prior art shows its scheme. For simplicity, one reference word line shown here is connected to one reference cell, but it is assumed that a middle point of stored 1 and 0 signals appears on the bit line when this reference word line is selected. When an even word line is accessed and the cell shown by a red dot is turned on. The stored signal, thus, appears on the bit line. Simultaneously, a lower one of the reference word line pair is tuned on to bring the reference signal on the adjacent bit line. According to the column address, multiplexer Mux 2 selects these two bit lines to connect to a sense amplifier. The sense amplifier compares two signals to judge read data as either 1 or 0. When an odd word line is accessed, an upper reference of the reference word line pair is selected. Thus, one pair of bit lines, which are adjacent each other, is always selected as inputs to the same amplifier that is shared in this array block The second example shown in FIG. 1 (B) is based on a reference bit line. It is assumed that the middle point of stored 1 and 0 signals appears on the reference bit line. The array block shares this reference bit line, which is always selected to provide the reference signal to the sense amplifier. Depending on the column address, Mux selects accessed bit line to connect as the input to the sense amplifier For reliable sensing, these reference lines mimic the line selected to read the cell content. Thus, precise tracking capability of all parasitic parameters on the reference line to the read line is very important. However, the conventional scheme is not optimized for this purpose. For example, in FIG. 1 (A), when a far end of word line to the reference word line is selected, parasitic parameters and AC and DC behaviors of the reference line are quite different from the accessed one.

The other point of the conventional reference schemes is yield issue. Since a large array block shares the reference line, when any defect hit it, the chip becomes dead.

The purpose of this invention is to realize reference lines for reliable sensing operations and to provide a means for yield enhancement.

There are known patents or patent publications dealing with reference line structures of semiconductor memory arrays:

U.S. Patent Publication (US 2010/0195422 to Imai) proposes a semiconductor integrated circuit including: a current difference sense type of a sense amplifier including: an input line connected to memory cells as a target to be read, a reference line connected to reference cells, and a first pre-charge circuit configured to pre-charge the input line and the reference line; a second pre-charge circuit configured to perform pre-charging of the input line and pre-charging of the reference line; and a control circuit configured to control the second pre-charge circuit so that the second pre-charge circuit may perform both the pre-charging of the input line and the pre-charging of the reference line independently of each other, and start both the pre-charging of the input line and the pre-charging of the reference line earlier than pre-charging by the first pre-charge circuit.

U.S. Patent Publication (US 2009/0067274 to Beer) discloses a memory device comprising a memory cell and an evaluation circuit, the memory cell being coupled with the evaluation circuit via a bit line. The memory device further comprises a reference line coupled with the evaluation circuit, the evaluation circuit being designed for amplifying a difference between electric potentials of the bit line and the reference line. Inputs of the evaluation circuit are directly connected to the bit line. Outputs of the evaluation circuit are coupled to the bit line via a switch.

U.S. Pat. No. 6,930,922 to Mori et al. discloses a reading circuit, for reading data from one memory cell of a plurality of memory cells, includes a plurality of division sensing circuits each connected to the one memory cell via a sensing line corresponding thereto among a plurality of sensing lines; and a current-voltage conversion circuit for converting a current flowing through each sensing line into a sensing voltage representing a potential of the corresponding sensing line. Each division sensing circuit includes a current load circuit for supplying a current to the one memory cell via a corresponding sensing line, and a sense amplifier for sensing a potential difference between the corresponding sensing line and a corresponding reference line of a plurality of reference lines. The current load circuit included in at least one division sensing circuit has a current supply capability different from that of the current load circuit included in another division sensing circuits.

SUMMARY

A principal object of the present invention is to achieve methods and systems for reliable sensing operations for semiconductor memories.

A further object of the invention is to achieve yield enhancements for semiconductor memories.

A further object of the present invention is to increase the number of active word reference lines.

A further object of the present invention is to increase the number of active bit reference lines.

A further object of the present invention is to increase the number of spare bit reference lines.

A further object of the present invention is to increase the number of spare word reference lines.

Moreover another object of the invention is to divide a memory array into sections having each own word reference lines.

Furthermore another object of the invention is to divide a memory array into sections having each own word reference lines and word spare lines.

A further object of the invention is to divide a memory array into segments having each own bit reference lines and bit spare lines.

In accordance with the objects of this invention a method to achieve reliable sensing operations for semiconductor memories requiring reading reference and to enhance the yield of the semiconductor memories has been achieved. The method invented comprises the following steps: (1) providing a semiconductor memory array, (2) dividing the semiconductor memory array into multiple parts, and (3) deploying in each of said parts reference lines.

In accordance with the objects of this invention a semiconductor memory array requiring reading references with improved sensing operations reliability and enhanced yield has been achieved. The memory array comprises: a memory array being divided in multiple parts, and reference lines deployed in each of said multiple parts.

BRIEF DESCRIPTION OF THE DRAWINGS

In the accompanying drawings forming a material part of this description, there is shown.

DESCRIPTION OF THE PREFERRED EMBODIMENTS

Four preferred embodiments of reference lines structures for better tracking capability of parasitic parameters associated with reading cells of a semiconductor memory are disclosed. It should be understood that the four embodiments disclosed are applied to Magneto-resistive Random Access Memory (MRAM). It should be noted that the invention can also be applied to any type of phase change memory (PCM) and to any other memory that requires a reading reference.

Figure 1:
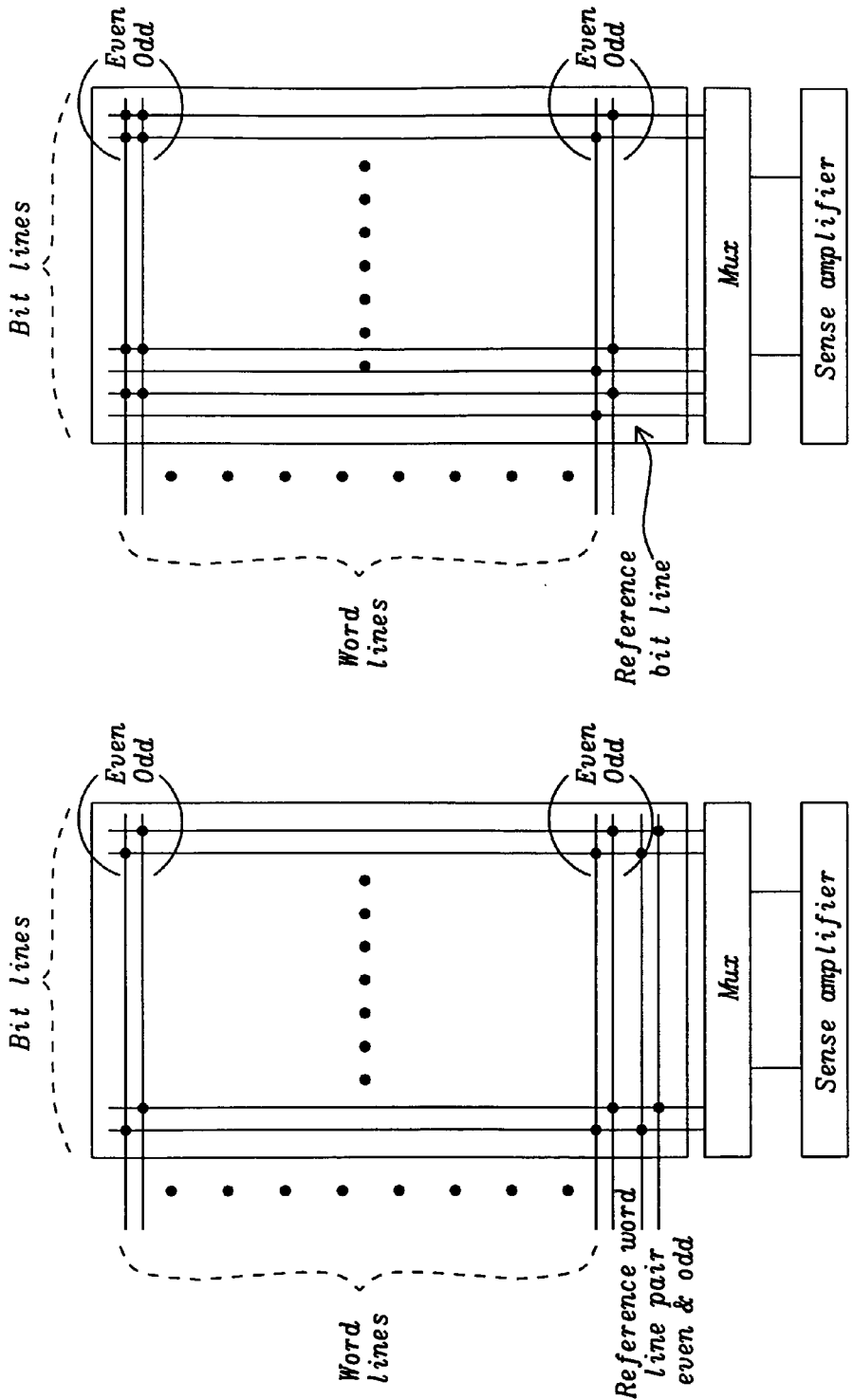
FIG. 1a prior art shows a reference word line of a conventional memory array structure.
FIG. 1b prior art shows a reference bit line of a conventional memory array structure.
Figure 2:
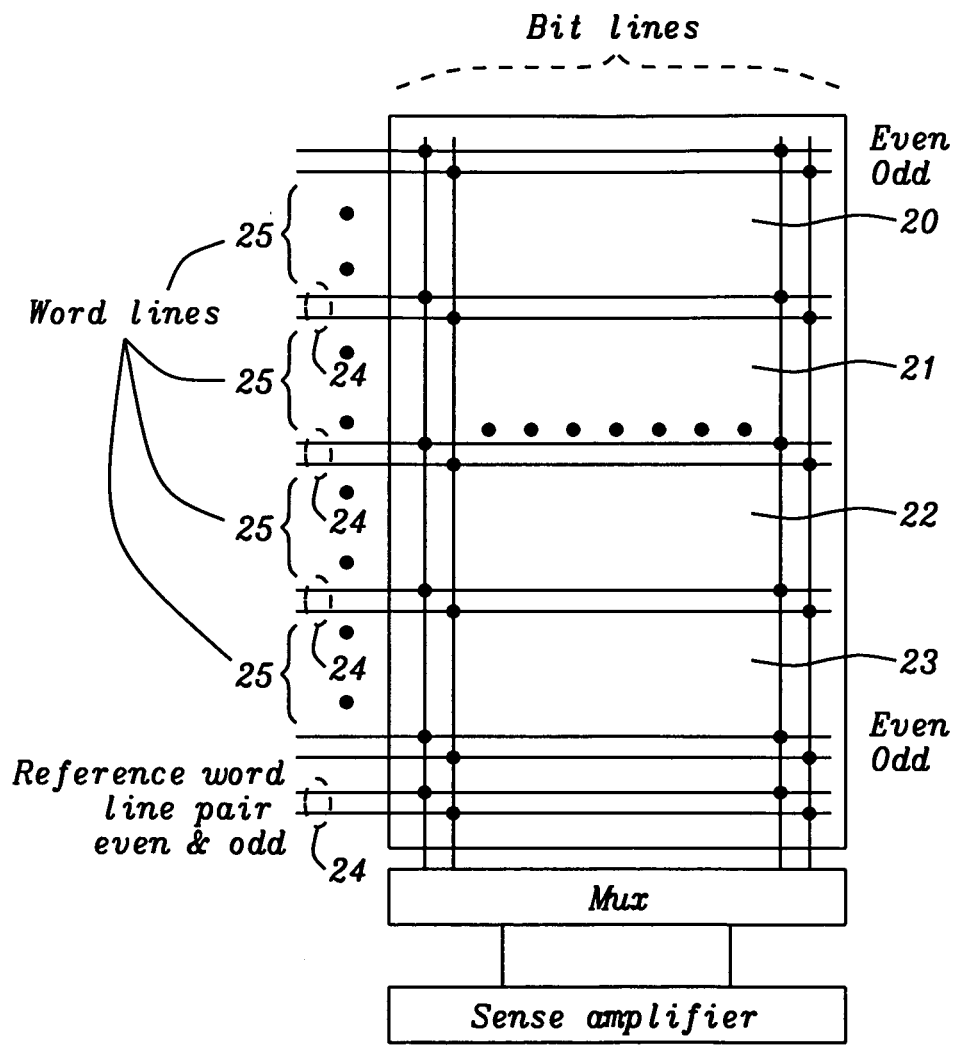
FIG. 2 shows a first embodiment of the present invention using multiple reference word lines.

FIG. 2 shows a first embodiment of the present invention applying reference word lines to the conventional scheme, shown in FIG. 1a prior art. For better tracking capability, multiple reference word lines are provided. As an example, FIG. 2 shows that the array is divided into four sections 20-23, and each one has a reference word line pair 24. Word lines 25 in each one of four sections 20-23 use the reference word line pair 24 in that section. Thus, the distance between an accessed line and the correspondent reference line is reduced, and hence the parasitic parameter tracking capability is enhanced significantly. Albeit FIG. 2 shows four sections only, the invention is of course not limited to four sections only. Any multiple numbers of sections are applicable depending on array situations. The location of the reference word line pair also does not have to be at the bottom of the section. It can be at top or middle of each section, or any arbitrary place regarding to the optimization.

Figure 3:
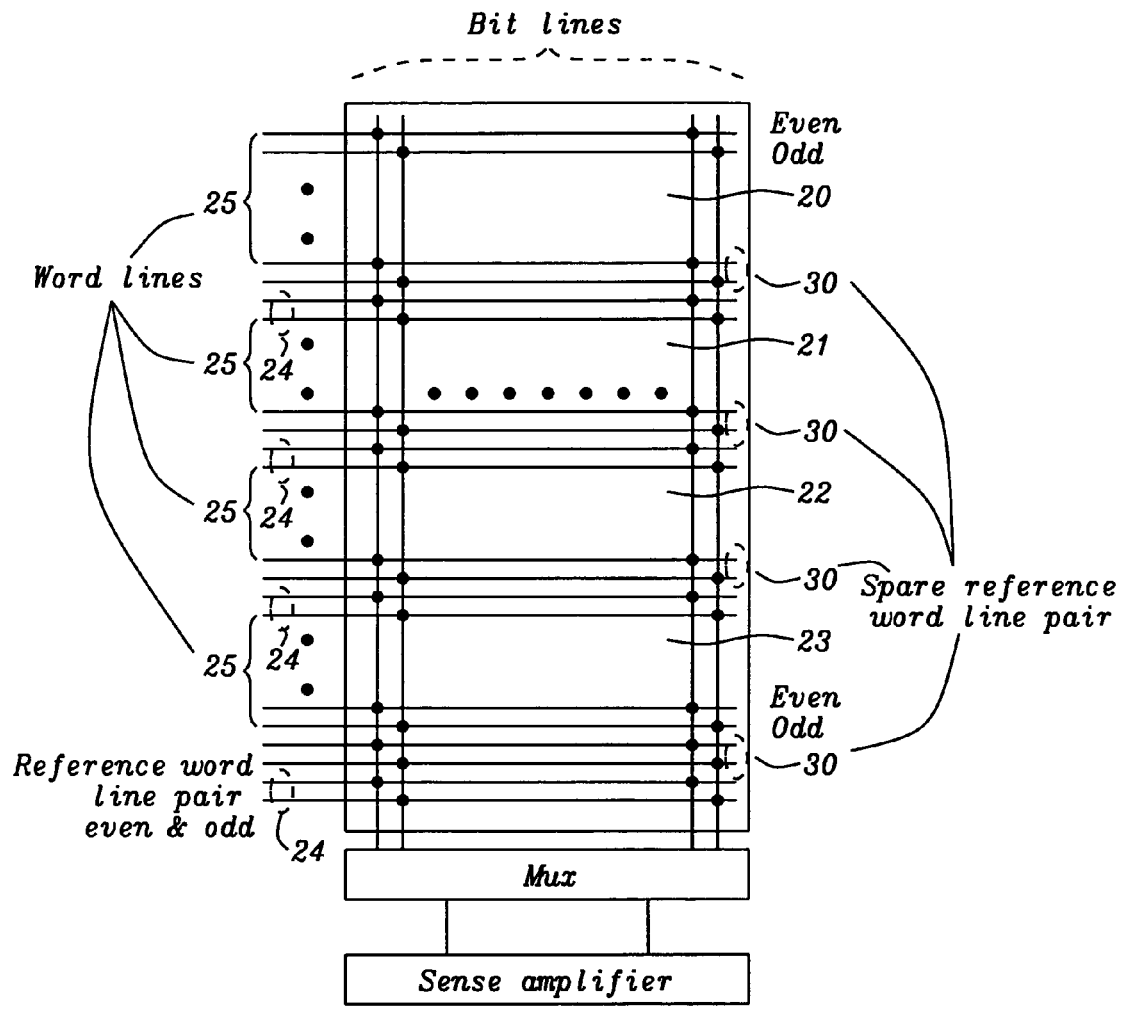
FIG. 3 shows a second embodiment of the invention using multiple reference word lines together with spare reference word lines.

When a defect hits a word line, memory chips generally replace it by a redundancy word line. Thus, there is no yield loss even if memory products have some defective word lines. The reference word lines are identical to word lines, and they are also subject to defects. However, if a defect hits any one of a reference word line, the memory chip affected cannot be saved, because all cells on word lines that share the defective reference word line cannot be read correctly. In order to solve this yield issue, the second embodiment of the present invention, shown in FIG. 3, illustrates spare pairs 30 of reference word lines deployed in FIG. 3 for a non-limiting example again in four sections 20-23.

Deploying a pair of spare references word lines makes circuit design of reference row decoding straight forward and simple but it should be noted that the invention is not limited to deploying only a pair of spare reference word lines. It is also possible to use a single spare reference word line or more than one pair of spare reference word lines or more than two spare reference word lines.

The spare reference word lines 30 in each section 20-23 can replace defective reference word lines in the same way as redundancy word lines. For simplicity, the spare reference word line pair is placed above the reference word line pair in the figure. However, its location is also not limited here only. To avoid cluster fail by large defects, placing the spare at the other end of the section than the "regular" reference word lines could be better, but any other location can be applicable.

Figure 4:
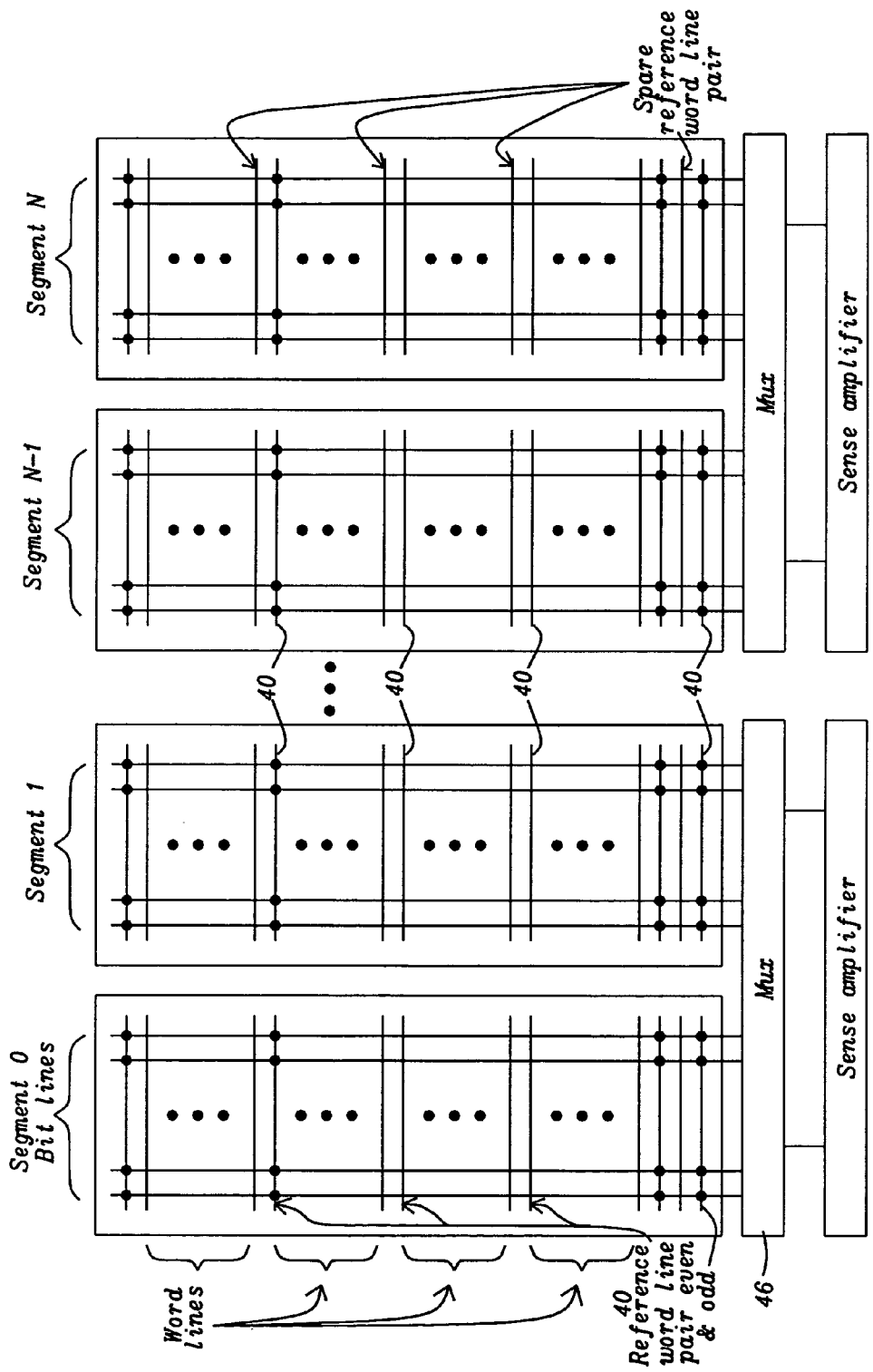
FIG. 4 shows a third embodiment of the present invention. It comprises multiple reference word lines with spare reference word lines for a segmented memory array.

A third embodiment of the present invention is shown in FIG. 4. The third embodiment comprises the application of the same multiple and spare reference word line pairs as shown in FIG. 3 but to a different array structure rather than the folded bit line scheme. It is based on a segmented array structure. When for example the top word line in the top section 42 of segment 0 is accessed, one of the reference word line pairs 40 of the top section of segment 1 is selected. Thus, read bit line in segment 0 and the referenced bit line in segment 1 are connected to the sense amplifier through multiplexer Mux 46.

The three embodiments of the invention shown in FIGS. 2-4 are all based on the reference word lines. The similar concept is also applicable to the arrays that use reference bit lines as shown in FIG. 1b prior art. The embodiments of the invention shown in FIGS. 2-4 are correspondently also applicable to bit reference lines. In this case each section has its own bit lines.

Figure 5:
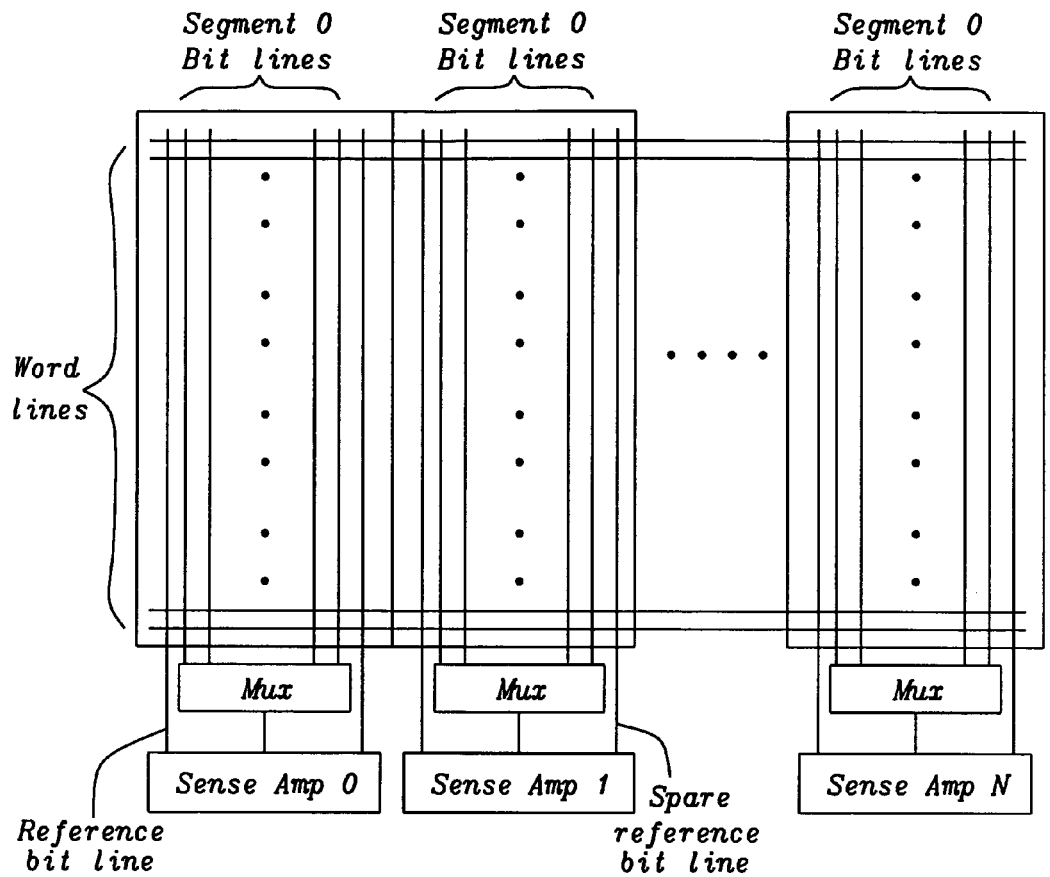
FIG. 5 shows a fourth embodiment of the present invention. Each segment of segments 0-N has reference bit lines and spare reference bit lines.

The fourth embodiment of the invention shown in FIG. 5 is such another example for using reference bit lines. As shown in FIG. 5 each segment of segments 0-N has reference bit lines and spare reference bit lines at its both end, but it should be noted that locations of the reference bit line and the spare bit reference lines are arbitrary and could be deployed at any suitable location.

Depending on process defect statistics in bit line direction, more than one reference bit line can be allocated to each section, if there is a relative high probability of bit line failures.

The embodiment of FIG. 5 could have alternatively only reference bit lines for each segment without deploying additional spare reference bit lines. In case there is a process defect pattern showing defects in both bit line and word line direction it might become necessary placing both spare reference bit lines and spare reference word lines in order to achieve a reasonable yield.

Figure 6:
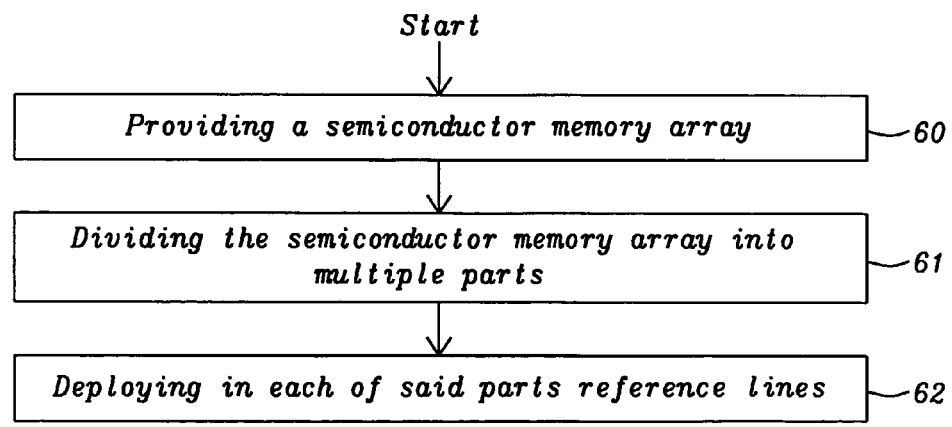
FIG. 6 illustrates a flowchart of a method invented to achieve reliable sensing operations for semiconductor memories and to enhance the yield of the semiconductor memories.

FIG. 6 illustrates a flowchart of a method invented to achieve reliable sensing operations for semiconductor memories and to enhance the yield of the semiconductor memories.

Step 60 of the method of FIG. 6 illustrates the provision of a semiconductor memory array. Step 61 describes dividing the semiconductor array into multiple parts. As described above these parts could be sections or segments or both and step 62 illustrates deploying in each of said parts reference lines. These reference lines could comprise bit reference lines, potentially spare bit reference lines, or word reference lines, and potentially spare word reference lines.

While the invention has been particularly shown and described with reference to the preferred embodiments thereof, it will be understood by those skilled in the art that various changes in form and details may be made without departing from the spirit and scope of the invention.

What is claimed is:

1. A method to achieve reliable sensing operations for semiconductor memories requiring reading reference and to enhance the yield of the semiconductor memories, comprising the following steps:
   (1) providing a semiconductor memory array;
   (2) dividing the semiconductor memory array into multiple sections; and
   (3) deploying in each of said sections a pair of reference word lines and a pair of spare reference word lines, wherein the pair of spare reference word lines is deployed at another end of the section than the related word reference lines.

2. The method of claim 1 wherein said memory is a MRAM memory.

3. The method of claim 1 wherein said memory is a phase change memory.

4. The method of claim 1 wherein the memory array is divided into multiple segments, wherein each segment is divided into multiple sections.

5. The method of claim 4 wherein in each of these sections a pair of reference word lines is deployed.

6. The method of claim 5 wherein in each of these sections a pair of spare reference word lines is deployed.

7. The method of claim 6 wherein the pair of spare reference word lines are deployed at another end of the section than the related word reference lines.

8. A semiconductor memory array requiring reading references with improved sensing operations reliability and enhanced yield comprises:
   a memory array being divided in multiple sections, wherein a pair of reference word lines and a pair of spare reference word lines are deployed in each of said sections, wherein the pair of spare reference word lines is deployed at another end of the section than the related word reference lines.

9. The semiconductor memory of claim 8 wherein said memory is a MRAM memory.

10. The semiconductor memory of claim 8 wherein said memory is a phase change memory.

11. The semiconductor memory array of claim 8 wherein the memory array is divided into multiple segments, wherein each segment is divided into multiple sections.

12. The semiconductor memory array of claim 11 wherein in each of these sections a pair of reference word lines is deployed.

13. The semiconductor memory array of claim 12 wherein in each of these sections a pair of spare reference word lines are deployed.

14. The semiconductor memory array of claim 13 wherein the pairs of spare reference word lines are deployed at another end of the section than the related word reference lines.

15. The semiconductor memory array of claim 8 wherein the memory array is divided into multiple segments.

* * * * *